United States Patent [19]

Ogawa et al.

[11] Patent Number: 5,019,442
[45] Date of Patent: May 28, 1991

[54] OVERLAY FILMS

[75] Inventors: Tadatoshi Ogawa; Seiichiro Ima, both of Ichihara, Japan

[73] Assignee: Sumitomo Chemical Company, Limited, Osaka, Japan

[21] Appl. No.: 385,079

[22] Filed: Jul. 25, 1989

[30] Foreign Application Priority Data

Jul. 29, 1988 [JP] Japan .................................. 63-191922

[51] Int. Cl.$^5$ ............................................ B32B 27/08
[52] U.S. Cl. ..................................... 428/215; 428/461; 428/483; 428/516; 428/518
[58] Field of Search ............... 428/215, 516, 518, 461, 428/483

[56] References Cited

FOREIGN PATENT DOCUMENTS 57-14377 3/1982 Japan .

Primary Examiner—P. C. Sluby
Attorney, Agent, or Firm—Stevens, Davis, Miller & Mosher

[57] ABSTRACT

The overlay film of the invention is obtained by forming a substrate layer composed of a resin composition comprising an ethylene copolymer such as ethylene-methacrylic acid ester copolymer and the like and a crystalline polyolefin having a melting point of 110° C. or higher on at least one side of the base layer composed of a crystalline polyolefin and the like by any method such as co-extrusion-laminating and the like followed by cooling. The overlay film is excellent in physical properties such as the anti-blocking property and the like and gives a metal-deposited film with brilliant appearance exhibiting high adhesive strength to the metal layer by vapor-deposition treatment. The metal-deposited film is serviceable for extensive uses including wrapping materials.

16 Claims, No Drawings

OVERLAY FILMS

The present invention relates to an overlay film for vapor-deposition of a metal. Particularly, the invention relates to an overlay film for vapor-deposition of a metal with a good anti-blocking property capable of providing a laminated film having a vapor-deposited metal layer bonded to the substrate film with a high adhesive strength and having an excellent appearance.

Metal-deposited films prepared by vapor-deposition of a metal on a plastic film have been widely used as a wrapping material and the like owing to the excellent gas-barrier property, light-shielding property and the like. Polyethylene terephthalate films, polypropylene films and the like have been conventionally used as the plastic film to be laminated but films of polyolefin exhibit poor adhesive strength between the metal layer and the substrate film when processed in a form of laminate by vapor-deposition of a metal. Many of counter-measures have been hitherto proposed thereupon. For instance, JP-B-57-14377 and JP-A-56-72037 propose a method comprising compounding a polypropylene modified with an unsaturated carboxylic acid into either polypropylene or a mixture of polypropylene and a large amount of an inorganic filler. JP-B-60-51553 discloses a method for improving the adhesive strength between the vapor-deposited metal and the substrate polypropylene film by roughening the film surface by slowly cooling at the time of film forming.

However, those methods are unsatisfactory because the method comprising compounding a polypropylene modified by graft-copolymerization cannot provide a film having a sufficient adhesive strength between the metal and the substrate, and the method comprising using a substrate film compounded with a large amount of an inorganic filler or a film which is surface-roughened by slowly cooling cannot give a film with a beautiful appearance.

Taking account of the present status of the art as mentioned above, the inventors have completed the present invention having an object of providing an overlay film which has a layer on which a metal is to be vapor-deposited (hereinafter referred to as a substrate layer) consisting of a polyolefin-type composition which exhibits adhesive strength between the metal and the film substantially upgraded without impairing the inherent features of polyolefin such as luster and the like.

The overlay film of the invention is obtained by co-extrusion laminating a substrate layer consisting of a resin composition which comprises an ethylene copolymer such as an ethylene-methacrylic acid ester copolymer and the like and a crystalline polyolefin having a melting point of 110° C. or higher onto at least one side of a base layer of a crystalline polyolefin and the like and cooling the resulting laminate. The overlay film of the invention is excellent in the physical properties such as anti-blocking property and the like and provides a metal-deposited laminate film having a high adhesive strength between the metal and the film and has a brilliant appearance when subjected to vapor deposition of a metal. The metal-deposited laminate film of the invention is serviceable for various purposes including wrapping materials and the like.

According to the present invention, there is provided an overlay film which comprises
(1) a base layer and
(2) a substrate layer formed on at least one side of the base layer, consisting of a resin composition comprising
  (i) 10 to 95% by weight of at least one ethylene copolymer containing 50 to 95% by weight of ethylene unit selected from the group consisting of ethyleneacrylic acid ester copolymers, ethylene-methacrylic acid ester copolymers, ethylene-acrylic acid copolymer, ethylene-methacrylic acid copolymer, ethylene-unsaturated glycidylate copolymers, ethyleneunsaturated dicarboxylic acid anhydride-acrylic acid ester terpolymers and ethylene-unsaturated dicarboxylic acid anhydride-methacrylic acid ester terpolymers and
  (ii) 5 to 90% by weight of a crystalline polyolefin having a melting point of 110° C. or higher.

The base layer used in the present invention is not critical if it can be formed into a film. Specific examples of constituent which can be used as the base layer are regenerated cellulose (cellophane), paper, paperboard, textiles, aluminum foil and the like. Specific examples of the polymers which can be used as the base layer are polyamide resin, polyester resin, polyvinyl alcohol, polyvinyl chloride and the like. Crystalline polyolefins are preferred since they improve the rigidity of the overlay films, the appearance of vapor-deposited surface of the final product, the film-formability and the like. In particular, crystalline polypropylene or propylene copolymers having a melting point of 130° C. or higher are more preferable.

The ethylene copolymer as a component of the resin composition which, in turn, forms the substrate layer contains 50 to 95% by weight of ethylene unit and is at least one member selected from the group consisting of
ethylene-acrylic acid ester copolymers,
ethylene-methacrylic acid ester copolymers,
ethylene-acrylic acid copolymer,
ethylene-methacrylic acid copolymer,
ethylene-unsaturated glycidylate copolymers,
ethylene-unsaturated dicarboxylic acid anhydride-acrylic acid ester terpolymers and
ethylene-unsaturated dicarboxylic acid anhydride-methacrylic acid ester terpolymers.
Of these copolymers, ethylene-methacrylic acid ester copolymers are preferred in view of the low-price and easy handling thereof. Each of these ethylene copolymers can be used either alone or as a mixture thereof.

These ethylene copolymers can be prepared by copolymerizing ethylene and a monomer copolymerizable with ethylene (hereinafter referred to as a comonomer). The copolymerization is initiated with a free-radical initiator such as organic peroxides, oxygen and the like and it is usually carried out at a temperature of 130° to 300° C. under a pressure of 500 to 3,000 kg/cm².

Specific examples of the ethylene-acrylic acid ester copolymers and the ethylene-methacrylic acid ester copolymers are copolymers of ethylene with methyl methacrylate, ethyl methacrylate, butyl methacrylates, 2-ethylhexyl methacrylate, methyl acrylate, ethyl acrylate, butyl acrylates, 2-ethylhexyl acrylate or the like. Of these, ethylene-methyl methacrylate copolymer is particularly preferred.

Ethylene-acrylic acid copolymer or ethylenemethacrylic acid copolymer is a copolymer of ethylene with methacrylic acid or with acrylic acid, respectively.

Specific examples of the ethylene-unsaturated glycidylate copolymers are copolymers of ethylene with an unsaturated glycidylate monomer such as glycidyl acrylate, glycidyl methacrylate, monoglycidyl itaconate and the like. A terpolymer containing ethylene, one of the unsaturated glycidylate monomers and vinyl acetate as the comonomers is also included therein. A terpolymer of ethylene, glycidyl methacrylate and vinyl acetate is preferred in particular.

Specific examples of the ethyleneunsaturated dicarboxylic acid anhydride-acrylic acid ester terpolymers and the ethylene-unsaturated dicarboxylic acid anhydride-methacrylic acid ester terpolymers are terpolymers of ethylene, an unsaturated dicarboxylic acid anhydride such as maleic anhydride, citraconic anhydride, tetrahydrophthalic anhydride and the like and an acrylic acid ester such as ethyl acrylate and the like or a methacrylic acid ester such as methyl methacrylate and the like. Of these, a terpolymer of ethylene, maleic anhydride and ethyl acrylate is preferred in particular.

The ethylene copolymers used in the present invention as listed above should contain 50 to 95% by weight of ethylene unit. Copolymers containing less than 50% by weight of ethylene unit exhibit a poor heat-resistance as the consequential overlay films and, on the other hand, copolymers which contain 95% by weight or more of ethylene unit exhibit an unsatisfactory improvement in adhesive strength to the objective vapor-deposited layer.

Preferably, the ethylene copolymers contain 75 to 95% by weight of ethylene unit and have a melting point of 85° C. or higher. More preferably, the copolymer have a melting point of 90° C. or higher and an ethylene content of 75 to 95% by weight.

The crystalline polyolefin as another component of the resin composition which, in turn, forms the substrate layer has a melting point of 110° C. or higher. Crystalline polyolefin having a melting point lower than 110° C. give an unpreferable appearance of the surface of laminated films processed by vapor deposition. In view of the rigidity and appearance of the laminated films after vapor-deposition, crystalline polypropylenes preferably have a melting point of 130° C. or higher. More preferably, they have a melting point of 155° C. or higher from the same viewpoint.

A resin composition comprising the above specified ethylene copolymer and the crystalline polyolefin is used as the principal component of the substrate layer of the overlay films of the present invention. The weight ratio of the ethylene copolymer to the crystalline polyolefin is 10-95:90-5, preferably, 30-90:70-10, more preferably 70-90:30-10. The resin compositions containing less than 10% by weight of the ethylene copolymer exhibit an unsatisfactory improvement of the adhesive strength between the metal layer and the substrate layer and, on the other hand, the resin compositions which contain more than 95% by weight of the ethylene copolymer deteriorate the heat-resistance and the anti-blocking property of the resultant overlay films.

For the stable manufacturing or easy handling of the films, the resin composition and the base layer may be further added with either or both of an anti-oxidant and an anti-blocking agent in amounts of 0.01 to 0.2 part by weight for the former and 3 parts by weight or less for the latter per 100 parts by weight of the resin composition or the base layer. The anti-oxidant preferably has a melting point of 80° C. or higher. Using anti-oxidants with a melting point lower than 80° C. or using antioxidants in an amount more than 0.2 part by weight tends to reduce the adhesive strength between the metal layer and the substrate layer. Using anti-oxidants in an amount less than 0.01 part by weight may sometimes provide unstable manufacturing of the films.

Specific examples of the anti-oxidant are tetra[methylene-3-(3,5-di-tertiary butyl-4-hydroxyphenyl) propionate] methane (trade name: Irganox ® 1010, manufactured by Ciba-Geigy Ltd.), 1,3,5-trimethyl2,4,6,-tris(3,5-di-tertiary butyl-4-hydroxybenzyl) benzene (trade name: Irganox ® 1330, manufactured by Ciba-Geigy Ltd.) and tris(3,5-di-tertiary butyl-4hydroxybenzyl) isocyanurate (trade name: Irganox ® 3114, manufactured by Ciba-Geigy Ltd.). Of these, Irganox ® 1010 is particularly preferred.

Specific examples of anti-blocking agent are fine powders of inorganic substances or polymeric substances such as high-density polyethylene, Nylon and the like. The compounding amount of the anti-blocking agent is preferably 3 parts by weight or less per 100 parts by weight of the resin composition or the base layer. Adding an anti-blocking agent in an amount more than 3 parts by weight may sometimes deteriorate the appearance of the resultant overlay films. Specific examples of anti-blocking agents are silicon dioxide, aluminum oxide, calcium carbonate and high-density polyethylenes having a melt flow rate of 1 or less.

As described above, the resin composition forming the substrate layer can be obtained by blending the above ethylene copolymer and the crystalline polyolefin with optional addition of either or both of the anti-oxidant and the anti-blocking agent. The method for blending these components is not critical and any of the conventionally known methods in the art is applicable. For example, a method comprising dry-blending the components with a mixing machine such as a Henschel mixer, a tumbler blender and the like, a method comprising melt-kneading and pelletizing the blended components with a monoaxial extruding machine or a multi-axial extruding machine or any other methods may be applicable. There may be applicable either of the blending methods in which every components are mixed at one time or the methods in which several components are preliminarily mixed in advance followed by adding the remainder thereto.

The overlay film of the present invention can be manufactured, for example, by (1) overlaying the base layer and the substrate in the molten state with employing any of the conventionally known methods such as the method comprising melt-kneading-extrusion with two extruding machines, the so-called feed-block method, the bilayer die-coextrusion method and the like followed by (2) cooling the resulting laminate with a cooling roll and the like. Furthermore, a method comprising forming a heat-seal layer consisting of the substrate layer/the base layer/the propylene copolymer or a method comprising overlaying the substrate layer onto the base layer with employing the dry-laminating method, the extrusion-laminating method or the like may also be adopted in the above procedure (1). Of these various methods, the method comprising co-extrusion-laminating is preferred and the method comprising unstretching co-extrusionlaminating is more preferred. The allotment of the thickness to each of the constituent layers of the overlay film is not critical. However, taking account of the rigidity and the manufacturing cost, the thickness of the substrate layer is preferably in the range of ½ to 1/100 of the total thickness of the overlay film.

The overlay film of the present invention exhibits the inherent characteristics even when the substrate layer is not surface-treated. However, further improvement of the adhesive strength to the metal layer is obtained when the surface layer is subjected to a surface treatment by any of the conventionally known methods such as corona treatment, flame treatment, plasma treatment and the like so that the surface has a wetting index of 37 dyne/cm or higher.

The method for vapor-depositing a metal is not critical and any of the known methods such as vacuum deposition, sputtering and the like is applicable. In general, a metal such as aluminum, nickel, silver, gold and the like is heated to be fused and evaporated in a vacuum deposition apparatus the inside pressure of which is reduced to about $10^{-4}$ torr or lower and the fume is deposited in a form of particulates on the surface of the overlay film which is wound up thereafter. The bell-jar vapor-deposition apparatus is known as an example of vacuum deposition apparatuses useful in such a method. The kind of the metal to be vapor-deposited is not critical but aluminum is preferred because of the inexpensiveness thereof. The thickness of the vapor-deposited metal layer is usually in the range of several m$\mu$ to 100 m$\mu$ but vapor-deposited layers with a thickness outside this range are still serviceable.

The invention is further explained in detail referring to the examples and comparative examples but without intent of restricting the scope of the invention to the modes shown in the examples.

The methods for various measurements and observations cited in any of the items in the explanation hereinbefore and in the examples hereinafter have been carried out according to the following.

(1) melt flow rate (MFR)

The measurements were carried out according to JIS K 7210 with applying the Condition-14 to polypropylene and the Condition-4 to polyethylene and ethylene copolymers.

(2) melting point

The measurements were carried out with a differential scanning calorimeter (manufactured by Perkin-Elmer Corp., DSC) and heating each test piece weighing 10 mg with a rate of temperature elevation of 5° C./min in a nitrogen atmosphere. The temperature at the largest peak of the melt-endothermic curve thus obtained is presumed as the melting point.

(3) haze

The measurements were carried out according to JIS K 6714.

(4) anti-blocking property

Two test pieces of the overlay film each with dimensions of 30 mm×120 mm were laid one over the other with 30 mm×40 mm area of the vapor-deposited layer facing the corresponding area of the other and were subjected to settling of the condition for 3 hours at 60° C. with loading of a 500 g weight. Thereafter, the test pieces were kept for 1 hour at 23° C. in an atmosphere with 50% relative humidity and subjected to shearing tensile test at a rate of 200 mm/minute to give the measured value of the strength required for detaching the pieces apart. Smaller values of the strength indicate the preferable anti-blocking property.

(5) appearance of the vapor-deposited metal surface

Using a bell-jar vapor-deposition apparatus, aluminum was deposited on the substrate layer of the overlay film under a reduced pressure of $5\times10^{-5}$ torr to give a laminated film with a vapor-deposited layer of aluminum and the surface appearance of the film was observed with the unaided eye.

(6) adhesive strength of the vapor-deposited layer

A biaxially stretched film of polypropylene (hereinafter referred to as OPP) with 25 $\mu$m of the thickness was pasted to the surface of the vapor-deposited layer of the laminated film with a vapor-deposited layer by the method comprising dry-laminating with a polyurethane adhesive applied in a solid amount of 3 g/m². The laminated film with the lining was subjected to heat-treatment for 24 hours at 40° C. followed by keeping for 2 hours at 23° C. and the adhesive strength between the laminated film with the vapor-deposited layer and the OPP layer was measured with a tensile testing machine.

The value of tensile strength thus obtained is presumed to be the adhesive strength of the vapor-deposited layer to the substrate layer since the vapor-deposited layer is peeled off from the overlay film owing to the adhesive strength between the OPP layer and the vapor-deposited layer sufficient to cause separation of the vapor-deposited layer.

EXAMPLE 1

(1) preparation of the resin composition for the substrate layer

A mixture was prepared by blending 80% by weight of an ethylene copolymer (A) with 95° C. of the melting point and 7 of the melt flow rate containing 85% by weight of ethylene and 15% by weight of methyl methacrylate and 20% by weight of a propylene polymer (a) with a melting point of 160° C. and a melt flow rate of 11 using a Henschel mixer. The mixture in an amount of 100 parts by weight was further added with 1 part by weight of high-density polyethylene with a density of 0.96 g/cm³ and a melt flow rate of 0.5 with mixing likewise and was subjected to meltextrusion at 220° C.

The above ethylene copolymer (A) was used without addition of any additives such as the antioxidant, anti-blocking agent and the like. The propylene polymer (a) was used with 0.1% by weight content of Irganox ® 1010. The mixture obtained through the above procedures is hereinafter referred to as the resin composition.

(2) preparation of the co-extruded films

Using the aforementioned propylene polymer with a melting point of 160° C. and a melt flow rate of 11 containing 0.1% by weight of Irganox ® 1010 as the base layer and the resin composition obtained in the above (1) for the substrate layer, an overlay film was prepared by melt-extrusion-laminating at 220° C. of the die temperature with two extruding machines and a bilayer T-die linked thereto followed by cooling at 30° C. with a cooling roll. The overlay film was composed of the substrate layer with a thickness of 5 $\mu$m and the base layer with a thickness of 25 $\mu$m and was subjected to corona discharging treatment to be provided with a wetting index of 40 dyne/cm.

Aluminum was vapor-deposited on the substrate layer of the overlay film using a bell-jar vapor-deposition apparatus under a reduced pressure of 5×10⁻⁵ torr.

(3) evaluation of the overlay film and the film with the vapor-deposited layer

The haze and the anti-blocking property were measured for the overlay film and the surface appearance and the adhesive strength of the vapor-deposited layer were evaluated for the laminated film with the vapor-deposited layer. The results are shown in Table 1.

COMPARATIVE EXAMPLE 1

Using the polypropylene polymer (a) for the base layer as employed in Example 1 alone, a monolayer film with a thickness of 30 μm and a wetting index of 40 dyne/cm was obtained by film-forming at 220° C. with a monolayer T-die extruding machine, cooling at 30° C. with a cooling roll and corona treatment. The results of valuation for the film thus obtained are shown in Table 1.

EXAMPLES 2 TO 4, COMPARATIVE EXAMPLES 2 TO 3

The same procedure as in Example 1 was repetated except the ethylene copolymer (A) contained in the resin composition for the substrate layer was replaced by an ethylene copolymer (B), (C), (D) or (E) and the crystalline polyolefin (a) was replaced by (b). In Example 2, the corona treatment was neglected. The components (B), (C), (D), (E) and (b) are indicated in the note appended to Table 2. The results of valuations are shown in Table 2.

In parallel, measurements of the adhesive strength between the resin composition for the substrate layer and an aluminum plate for some typical samples but verifying absence of inevitable correspondence between the adhesive strength in these cases and the adhesive strength of the vapor-deposited layer.

The measurements of the adhesive strength of the resin composition to the aluminum plate were carried out in the following manner. The resin composition for the substrate layer was placed between two sheets of the aluminum plates each having a thickness of 300 μm followed by heat-pressing for 10 minutes at 200° C. with 50 kg/cm²F, cooling for 5 minutes at 30° C. and measurement of the adhesive strength using a tensile testing machine.

EXAMPLE 5, COMPARATIVE EXAMPLE 4

Replacing the ethylene copolymer in the resin composition for the substrate layer, experiments and valuations were carried out similarly to Example 1 except that blending was carried out with a Henschel mixer for 1 minute instead of melt-extrusion. The results of valuation are shown in Table 3.

EXAMPLES 6 TO 8, COMPARATIVE EXAMPLES 5 TO 7

Experiments and valuations were carried out similarly to Example 1 except that the crystalline polyolefin for the base layer and the composition of the substrate layer were changed. The results of valuations are shown in Table 4.

An overlay film for vapor-deposition of a metal exhibiting steeply improved adhesiveness of the vapor-deposited metal layer could be obtained without impairing the inherent features of the polyolefin films such as luster and the like by forming the substrate layer on the base layer using the resin composition which comprises an ethylene copolymer specified in the invention and a crystalline polyolefin having a melting point of 110° C. or higher.

TABLE 1

| Example No. & Comparative Example No. | substrate layer | | | | | | | |
|---|---|---|---|---|---|---|---|---|
| | ethylene copolymer | | | crystalline polyolefin | | | corona treatment |
| | kind | ethylene content wt % | melting point °C. | compounded amount wt % | kind | melting point °C. | compounded amount wt % | |
| Example 1 | (A) | 85 | 95 | 80 | (a) | 160 | 20 | done |
| Comparative Example 1 | — | — | — | — | — | — | — | done |

| Example No. & Comparative Example No. | base layer kind | physical property of overlay film | | physical property of film after vapor-deposition | |
|---|---|---|---|---|---|
| | | haze % | anti-blocking property g/100 cm² | appearance of deposited layer | adhesive strength of deposited layer g/15 mm |
| Example 1 | (a) | 4.3 | 40 | good | >300 |
| Comparative Example 1 | (a) | 3.2 | 20 | good | 70 | note:
details of sample — melt flow rate (g/10 minutes)
(A) ethylene-methyl methacrylate copolymer (85 wt %) (15 wt %) — 7
(a) propylene polymer — 11

TABLE 2

| Example No. & Comparative Example No. | substrate layer | | | | | | | |
|---|---|---|---|---|---|---|---|---|
| | ethylene copolymer | | | | crystalline polyolefin | | | corona treatment |
| | kind | ethylene content wt % | melting point °C. | compounded amount wt % | kind | melting point °C. | compounded amount wt % | |
| Example 2 | (A) | 85 | 95 | 80 | (b) | 145 | 20 | no |
| Example 3 | (B) | 83 | 93 | 80 | (b) | 145 | 20 | done |
| Example 4 | (C) | 91 | 105 | 80 | (b) | 145 | 20 | done |
| Comparative Example 2 | (D) | 89 | 98 | 80 | (b) | 145 | 20 | done |
| Comparative | (E) | 5 | 140 | 80 | (b) | 145 | 20 | done |

TABLE 2-continued

Example 3

| Example No. & Comparative Example No. | base layer kind | physical property of overlay film anti-blocking property g/100 cm² | physical property of film after vapor-deposition | | adhesive strength to aluminum g/15 mm |
|---|---|---|---|---|---|
| | | | appearance of deposited layer | adhesive strength of deposited layer g/15 mm | |
| Example 2 | (a) | 45 | good | 160 | 2400 |
| Example 3 | (a) | 30 | good | 160 | 6600 |
| Example 4 | (a) | 35 | good | 170 | — |
| Comparative Example 2 | (a) | 45 | good | 40 | 2300 |
| Comparative Example 3 | (a) | 25 | good | 20 | 9400 | note:

| details of sample | melt flow rate (g/10 minutes) |
|---|---|
| (A) ethylene-methyl methacrylate copolymer (85 wt %) (15 wt %) | 7 |
| (B) ethylene-glycidyl methacrylate- (83 wt %) (12 wt %) vinyl acetate copolymer (5 wt %) | 5 |
| (C) ethylene-ethyl acrylate- (91 wt %) (6 wt %) maleic anhydride copolymer (3 wt %) | 5 |
| (D) ethylene-vinyl acetate copolymer (89 wt %) (11 wt %) | 6 |
| (E) maleic anhydride grafted ethylene- (grafted amount 0.5 wt %) (5 wt %) propylene copolymer (95 wt %) | 9 |
| (a) propylene polymer | 11 |
| (b) ethylene-propylene copolymer (3 wt %) (97 wt %) | 6 |

TABLE 3

| Example No. & Comparative Example No. | substrate layer | | | | | | | corona treatment |
|---|---|---|---|---|---|---|---|---|
| | ethylene copolymer | | | | crystalline polyolefin | | | |
| | kind | ethylene content wt % | melting point °C. | compounded amount wt % | kind | melting point °C. | compounded amount wt % | |
| Example 5 | (A-1) | 90 | 101 | 80 | (a) | 160 | 20 | done |
| Comparative Example 4 | (F) | 100 | 110 | 80 | (a) | 160 | 20 | done |

| Example No. & Comparative Example No. | base layer kind | physical property of overlay film anti-blocking property g/100 cm² | physical property of film after vapor-deposition | |
|---|---|---|---|---|
| | | | appearance of deposited layer | adhesive strength of deposited layer g/15 mm |
| Example 5 | (a) | 30 | good | 170 |
| Comparative Example 4 | (a) | 25 | good | 30 | note:

| details of sample | melt flow rate (g/10 minutes) |
|---|---|
| (A-1) ethylene-methyl methacrylate copolymer (90 wt %) (10 wt %) | 9 |
| (F) low-density polyethylene | 7 |
| (a) propylene polymer | 11 |

TABLE 4

| Example No. & Comparative Example No. | substrate layer | | | | | | | corona treatment |
|---|---|---|---|---|---|---|---|---|
| | ethylene copolymer | | | | crystalline polyolefin | | | |
| | kind | ethylene content wt % | melting point °C. | compounded amount wt % | kind | melting point °C. | compounded amount wt % | |
| Example 6 | (A) | 85 | 95 | 70 | (b) | 145 | 30 | done |
| Example 7 | (A) | 85 | 95 | 90 | (b) | 145 | 10 | done |
| Example 8 | (A-2) | 63 | 54 | 30 | (d) | 117 | 70 | done |
| Comparative Example 5 | (A) | 85 | 95 | 5 | (b) | 145 | 95 | done |
| Comparative Example 6 | (A) | 85 | 95 | 100 | — | — | — | done |
| Comparative Example 7 | (A) | 85 | 95 | 80 | (a) | 160 | 20 | done |

| Example No. & Comparative | base | physical property of overlay film anti-blocking | physical property of film after vapor-deposition | |
|---|---|---|---|---|
| | | | appearance of | adhesive strength of |

TABLE 4-continued

| Example No. | layer kind | property g/100 cm² | deposited layer | deposited layer g/15 mm | other |
|---|---|---|---|---|---|
| Example 6 | (c) | 30 | good | 180 | |
| Example 7 | (c) | 50 | good | >300 | |
| Example 8 | (c) | 60 | almost good | 160 | |
| Comparative Example 5 | (c) | 25 | good | 50 | |
| Comparative Example 6 | (c) | 80 | poor | >300 | |
| Comparative Example 7 | (d) | 50 | almost good | >300 | inferior rigidity of film | note:

| details of sample | melt flow rate (g/10 minutes) |
|---|---|
| (A) ethylene-methyl methacrylate copolymer (85 wt %) (15 wt %) | 7 |
| (A-2) ethylene-methyl methacrylate copolymer (63 wt %) (37 wt %) | 45 |
| (a) propylene polymer | 11 |
| (b) ethylene-propylene copolymer (3 wt %) (97 wt %) | 6 |
| (c) ethylene-propylene-butene-1 copolymer melting point 139° C. (2 wt %) (92 wt %) (6 wt %) | 6 |
| (d) ethylene-butene-1 copolymer (86 wt %) (14 wt %) | 10 |

What is claimed is:

1. An overlay film which comprises
   (1) a base layer and
   (2) a substrate layer formed on at least one side of said base layer, consisting of a resin composition which comprises
      (i) 10 to 95% by weight of at least one ethylene copolymer containing 50 to 95% by weight of ethylene unit selected from the group consisting of ethyleneacrylic acid ester copolymers, ethylene-methacrylic acid ester copolymers, ethylene-acrylic acid copolymer, ethylene-methacylic acid copolymer, ethylene-unsaturated glycidylate copolymers, ethylene-unsaturated dicarboxylic acid anhydride-acrylic acid ester terpolymers and ethylene-unsaturated dicarboxylic acid anhydridemethacrylic acid ester terpolymers and
      (ii) 5 to 90% by weight of a crystalline polyolefin having a melting point of 110° C. or higher.

2. An overlay film according to claim 1, wherein said ethylene copolymer contains 75 to 95% by weight of ethylene unit and has a melting point of 85° C. or higher.

3. An overlay film according to claim 1, wherein said base layer is a crystalline polypropylene.

4. An overlay film according to claim 3, wherein said base layer is a crystalline polypropylene having a melting point of 130° C. or higher.

5. An overlay film according to claim 1, wherein said ethylene copolymer is an ethylene-acrylic acid ester copolymer and/or an ethylene-methacrylic acid ester copolymer.

6. An overlay film according to claim 5, wherein said ethylene copolymer is at least one member selected from the group consisting of ethylene-methyl methacrylate copolymer, ethylene-ethyl methacrylate copolymer, ethylene-butyl methacrylate copolymer, ethylene-2-ethylhexyl methacrylate copolymer, ethylenemethyl acrylate copolymer, ethylene-ethyl acrylate copolymer, ethylene-butyl acrylate copolymer and ethylene-2-ethylhexyl acrylate copolymer.

7. An overlay film according to claim 6, wherein said ethylene copolymer is ethylene-methyl methacrylate copolymer.

8. An overlay film according to claim 1, wherein said ethylene copolymer and said crystalline polyolefin are compounded in said resin composition in a weight ratio of 30-90 : 70-10.

9. An overlay film according to claim 1, wherein said resin composition further comprises an antioxidant and/or an anti-blocking agent.

10. An overlay film according to claim 1, wherein said base layer comprises an anti-oxidant and/or an anti-blocking agent.

11. An overlay film according to claim 1, wherein said crystalline polyolefin is crystalline polypropylene.

12. An overlay film according to claim 11, wherein said crystalline polyolefin is crystalline propylene having a melting point of 130° C. or higher.

13. An overlay film according to claim 1, on which a metal is vapor-deposited.

14. An overlay film according to claim 13, wherein said metal is aluminum.

15. An overlay film according to claim 1, wherein the thickness of said substrate layer is ½ to 1/100 of the thickness of the overlay film.

16. An overlay film according to claim 1, wherein the wetting index of said substrate layer is 37 dyne/cm or higher.

* * * * *